(12) United States Patent
Suzuki

(10) Patent No.: US 9,179,553 B2
(45) Date of Patent: Nov. 3, 2015

(54) METHOD OF MANUFACTURING MULTILAYER WIRING BOARD

(71) Applicant: NGK SPARK PLUG CO., LTD., Nagoya-shi, Aichi-ken (JP)

(72) Inventor: Kenji Suzuki, Iwakura (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 74 days.

(21) Appl. No.: 13/778,004

(22) Filed: Feb. 26, 2013

(65) Prior Publication Data

US 2013/0219712 A1 Aug. 29, 2013

(30) Foreign Application Priority Data

Feb. 29, 2012 (JP) ................................. 2012-044145
Dec. 5, 2012 (JP) ................................. 2012-266357

(51) Int. Cl.
| | | |
|---|---|---|
| H05K 3/32 | (2006.01) | |
| H05K 3/28 | (2006.01) | |
| H05K 1/18 | (2006.01) | |
| H05K 3/00 | (2006.01) | |
| H05K 3/46 | (2006.01) | |

(52) U.S. Cl.
CPC ............... *H05K 3/284* (2013.01); *H05K 1/186* (2013.01); *H05K 3/0097* (2013.01); *H05K 3/4652* (2013.01); *H05K 2203/1536* (2013.01); *Y10T 29/49146* (2015.01)

(58) Field of Classification Search
CPC ..... H05K 3/30; H05K 3/3436; H05K 3/3478; H05K 3/284; H05K 3/0097; H05K 3/4652; H05K 1/186; H05K 2203/1536; Y10T 29/49146

USPC ............................ 29/825, 830, 832, 840, 852
See application file for complete search history.

(56) References Cited

U.S. PATENT DOCUMENTS 6,489,685 B2 * 12/2002 Asahi et al. ................... 257/774
7,732,712 B2   6/2010 Yamano
(Continued)

FOREIGN PATENT DOCUMENTS

| CN | 100525580 C | 8/2009 |
|---|---|---|
| JP | 2000286365 A | * 10/2000 |

(Continued)

OTHER PUBLICATIONS

KIPO, Notification of Provisional Refusal issued in corresponding Korean Application No. 10-2013-0021255, issued Jun. 19, 2015.

(Continued)

*Primary Examiner* — Carl Arbes
(74) *Attorney, Agent, or Firm* — Stites & Harbison, PLLC; Jeffrey A. Haeberlin; James R. Hayne

(57) ABSTRACT

Embodiments disclosed herein include a method of manufacturing a multilayer wiring board that includes the steps of forming, on a support substrate, a laminate in which insulating layers and conductor layers are alternately laminated, accommodating a semiconductor chip in an opening of a prepreg which is formed on the surface of the laminate and that includes a sheet-like glass fiber impregnated with resin, and heating and pressurizing the surface of the prepreg in a state where the semiconductor chip is accommodated in the opening.

9 Claims, 12 Drawing Sheets

(56) References Cited

U.S. PATENT DOCUMENTS

| | | | |
|---|---|---|---|
| 8,240,032 B2 * | 8/2012 | Iihola et al. | 29/834 |
| 2006/0260122 A1 | 11/2006 | Honjo et al. | |
| 2006/0272854 A1 | 12/2006 | Yamano | |
| 2006/0278967 A1 * | 12/2006 | Tuominen et al. | 257/686 |
| 2008/0295326 A1 * | 12/2008 | Tuominen et al. | 29/832 |
| 2009/0244865 A1 * | 10/2009 | Tanaka | 361/764 |
| 2010/0206621 A1 | 8/2010 | Wada | |
| 2011/0155443 A1 | 6/2011 | Maeda et al. | |

FOREIGN PATENT DOCUMENTS

| | | |
|---|---|---|
| JP | 2004-63583 A | 2/2004 |
| JP | 2006-339421 A | 12/2006 |
| JP | 2009-105302 A | 5/2009 |
| JP | 2011-216675 A | 10/2011 |
| KR | 10-2009-0111380 A | 10/2009 |
| TW | 201132268 A | 9/2011 |

OTHER PUBLICATIONS

Taiwan Intellectual Property Office, Notification for the Opinion of Examination issued in corresponding Taiwanese Patent Application No. 102106628, dated Jul. 8, 2015.

* cited by examiner

METHOD OF MANUFACTURING MULTILAYER WIRING BOARD

CROSS REFERENCE TO RELATED APPLICATIONS

The present application claims priority from Japanese Patent Application No. 2012-044145, filed on Feb. 29, 2012; and Japanese Patent Application No. 2012-266357 filed on Dec. 5, 2012, the disclosure of which are herein incorporated by references in their entirety.

BACKGROUND OF THE INVENTION

1. Field of the Invention

The present invention relates to a method of manufacturing a multilayer wiring board in which a plurality of insulating layers and a plurality of conductor layers are alternately laminated.

2. Description of Related Art

In the related art, a method is known in which, after a semiconductor chip is mounted on an insulating layer, an insulating layer is further formed so as to cover the semiconductor chip, thereby manufacturing a multilayer wiring board embedded with a semiconductor chip (for example, JP-A-2006-339421).

However, in the technique described in JP-A-2006-339421, when forming the insulating layer so as to cover the semiconductor chip, the pressing force of the insulating layer formed on the semiconductor chip against the semiconductor chip is applied to the semiconductor chip, causing an increase in a failure rate of the semiconductor chip embedded in the multilayer wiring board.

BRIEF SUMMARY OF THE INVENTION

The invention has been accomplished in consideration of this problem, and an object of the invention is to provide a technique for suppressing the occurrence of failure in an electronic component embedded in a multilayer wiring board.

According to a first aspect of the invention, there is provided a method of manufacturing a multilayer wiring board in which a plurality of insulating layers and a plurality of conductor layers are alternately laminated. The method includes a first step of forming, on a support substrate, a laminate in which at least one insulating layer and at least one conductor layer are alternately laminated, a second step of fixing an electronic component on a surface of the laminate formed by the first step, a third step of forming an opening capable of accommodating the electronic component in a prepreg which includes a sheet-like glass fiber impregnated with resin, a fourth step of laminating the prepreg with the opening formed by the third step on the surface of the laminate such that the electronic component fixed by the second step is accommodated in the opening, and a fifth step of heating and pressurizing a surface of the prepreg laminated on the surface of the laminate by the fourth step.

In the method of manufacturing a multilayer wiring board configured as described above, in the second step, the electronic component is fixed on the surface of the laminate formed by the first step, and in the fourth step, the prepreg in which the opening capable of accommodating the electronic component is formed is laminated on the surface of the laminate. For this reason, in the step of laminating the prepreg on the surface of the laminate, the pressing force of the prepreg against the electronic component is not applied to the electronic component.

Thereafter, in the fifth step, if the surface of the laminated prepreg is heated and pressurized, resin in the prepreg is molten and flows into the opening, and resin is filled in the opening. Accordingly, the electronic component is buried in the prepreg. In the fifth step, since the resin is molten and flows into the opening, and resin is formed on the electronic component, the pressing force of the prepreg against the electronic component is not applied to the electronic component.

With the above, when the electronic component is buried in the prepreg the pressing force of the prepreg against the electronic component is not applied to the electronic component, thereby suppressing the occurrence of failure in the electronic component embedded in the multilayer wiring board.

In the third step, since the opening capable of accommodating the electronic component is formed in the prepreg, glass fiber is not arranged above the electronic component in the prepreg. For this reason, when forming via holes for electrical connection between the electronic component buried in the prepreg and the conductor layer formed on the prepreg, it is not necessary to pass through a material having high rigidity, such as glass fiber, in the prepreg.

In the method of manufacturing a multilayer wiring board according to the first aspect of the invention, in the first step, pads for electrical connection to connection terminals of the electronic component may be formed on the surface of the laminate, and in the second step, after a solder paste may be provided on the pads and the electronic component is placed on the surface of the laminate, the solder paste may be reflowed to fix the electronic component such that voids are formed between the pads and the connection terminals.

In the method of manufacturing a multilayer wiring board configured as described above, since the voids are formed between the pads and the connection terminals, molten resin can flow below the electronic component. Accordingly, when the electronic component is buried in the prepreg, the entire surface of the electronic component (that is, the top surface, the lateral surface, and the bottom surface of the electronic component) can be covered with resin.

In the method of manufacturing a multilayer wiring board according to the first aspect of the invention, when a direction orthogonal to a lamination direction of the laminate is referred to as a lamination orthogonal direction, the length in the lamination orthogonal direction of the pads may be shorter than the length in the lamination orthogonal direction of the electronic component placed on the surface of the laminate.

In the method of manufacturing a multilayer wiring board configured as described above, when molten resin flows below the electronic component, it is possible to suppress the occurrence of a situation in which the flow of molten resin is obstructed by the pads below the electronic component, thereby easily forming resin below the electronic component.

In the method of manufacturing a multilayer wiring board according to the first aspect of the invention, an insulating layer, including on a surface thereof a metal layer serving as a conductor layer that is formed through patterning and including a sheet-like glass fiber impregnated with resin, may be laminated on the surface of the prepreg, and in the fifth step, the prepreg may be heated and pressurized through the metal layer.

In the method of manufacturing a multilayer wiring board configured as described above, after the prepreg is heated and pressurized, the metal layer is patterned and thus used as the conductor layer of the multilayer wiring board. For this reason, it is possible to save a metal material for the amount corresponding to the metal layer compared to a process in which a metal layer is removed after a prepreg is heated and pressurized, and a conductor layer is laminated.

According to a second aspect of the invention, there is provided a method of manufacturing a multilayer wiring board in which a plurality of insulating layers and a plurality of conductor layers are alternately laminated. The method includes a step of forming, on a support substrate, a laminate in which at least one insulating layer and at least one conductor layer are alternately laminated, a step of forming a prepreg, which has an opening capable of accommodating an electronic component and a sheet-like glass fiber impregnated with resin, on a surface of the laminate, a step of accommodating the electronic component in the opening, and a step of heating and pressurizing the surface of the prepreg.

In the method of manufacturing a multilayer wiring board configured as described above, in the step of forming the prepreg, the prepreg which has the opening capable of accommodating the electronic component is formed on the surface of the laminate, and in the step of accommodating the electronic component, the electronic component is accommodated in the opening. For this reason, in the step of accommodating the electronic component in the opening, the pressing force of the prepreg against the electronic component is not applied to the electronic component.

Thereafter, in the step of heating and pressurizing the surface of the prepreg, resin in the prepreg is molten and flows into the opening, and resin is filled in the opening. Accordingly, the electronic component is buried in the prepreg. In the step heating and pressurizing, since resin is molten and flows into the opening, and resin is formed on the electronic component, the pressing force of the prepreg against the electronic component is not applied to the electronic component.

With the above, when the electronic component is buried in the prepreg, the pressing force of the prepreg against the electronic component is not applied to the electronic component, thereby suppressing the occurrence of failure in the electronic component embedded in the multilayer wiring board.

In the method of manufacturing a multilayer wiring board according to the second aspect of the invention, the step of forming the prepreg may include a step of forming the opening in the prepreg, and a step of laminating the prepreg having the opening on the surface of the laminate, or after the prepreg is laminated on the surface of the laminate, the opening may be formed in the prepreg. Accordingly, the prepreg having the opening for accommodating the electronic component can be formed on the surface of the laminate.

DETAILED DESCRIPTION OF EXEMPLARY EMBODIMENTS OF THE INVENTION

First Embodiment

Hereinafter, a first embodiment of the present invention will be described with reference to the drawings.

Figure 1:
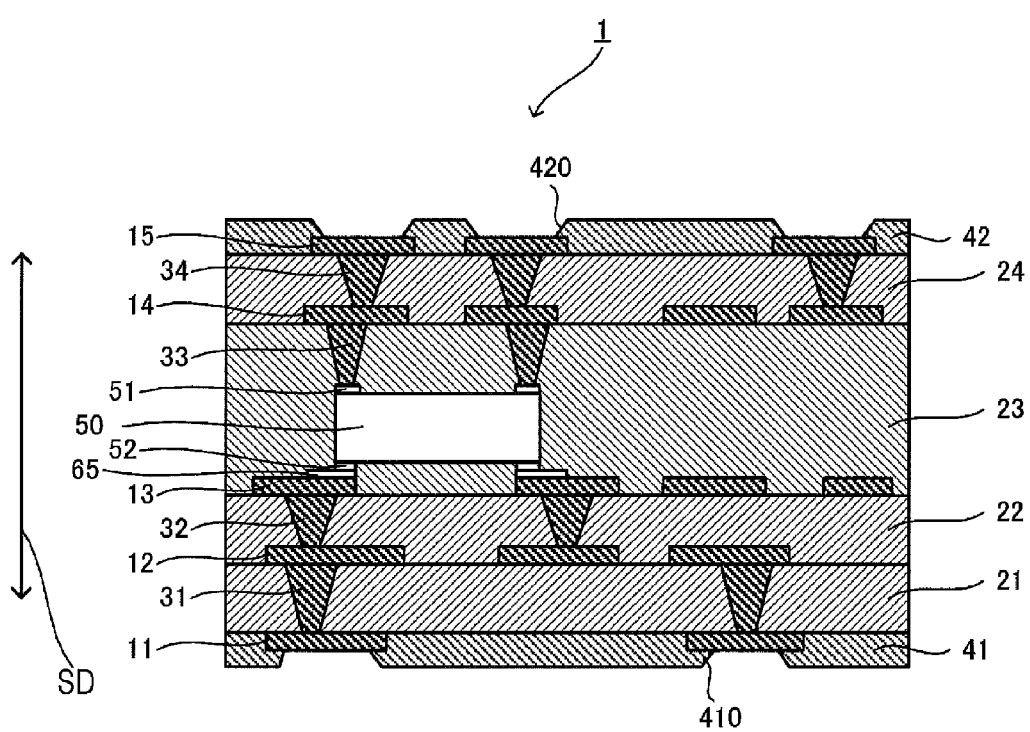
FIG. 1 is a sectional view showing the schematic configuration of a multilayer wiring board.

As shown in FIG. 1, a multilayer wiring board 1 of the embodiment to which the invention is applied has a plurality of (in this embodiment, five) conductor layers 11, 12, 13, 14, and 15 and a smaller number of (in this embodiment, four) insulating layers 21, 22, 23, and 24 than the conductor layers 11 to 15 by one are alternately laminated in a lamination direction SD.

Via conductors 31, 32, 33, and 34 which are formed to extend in the lamination direction SD are respectively provided in the insulating layers 21, 22, 23, and 24 constituting the multilayer wiring board 1. Accordingly, the conductor layers 11, 12, 13, and 14 are respectively electrically connected to the conductor layers 12, 13, 14, and 15.

A solder resist layer 41 is laminated on the side of the insulating layer 21 opposite to the insulating layer 22 so as to cover the insulating layer 21, and a solder resist layer 42 is laminated on the side of the insulating layer 24 opposite to the insulating layer 23 so as to cover the insulating layer 24. The solder resist layers 41 and 42 respectively have openings 410 and 420 in the regions where the conductor layers 11 and 15 are arranged.

Figure 2:
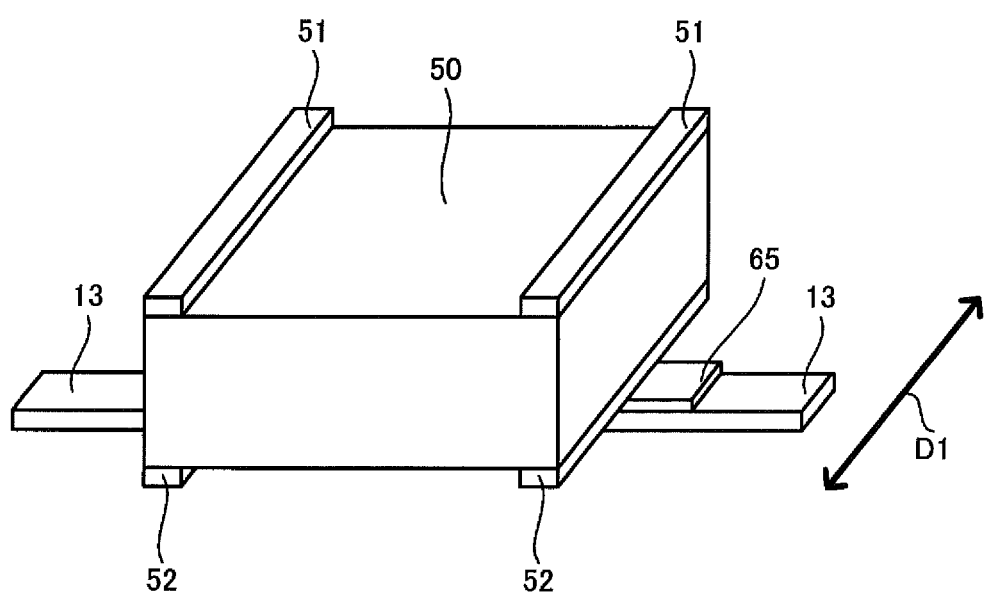
FIG. 2 is a perspective view showing the arrangement of a semiconductor chip and a conductor layer.

A semiconductor chip 50 (in this embodiment, a laminated capacitor) is buried in the insulating layer 23 constituting the multilayer wiring board 1. As shown in FIG. 2, the semiconductor chip 50 is formed in a rectangular parallelepiped shape, and is provided with connection terminals 51 and connection terminals 52 on the top surface and the bottom surface. The connection terminals 51 are electrically connected to the conductor layer 14 through the via conductor 33, and the connection terminals 52 are electrically connected to conductor layer 13 through solder paste 65. The connection terminals 51 and the connection terminals 52 are formed along the short sides of the rectangular top and bottom surfaces. The conductor layer 13, which is electrically connected to the connection terminals 52, serves as pads for placing the semiconductor chip 50, and is formed such that the length in the short-side direction D1 of the bottom surface of the semiconductor chip 50 is shorter than the connection terminals 52.

Next, a method of manufacturing the multilayer wiring board 1 to which the invention is applied will be described.

Figure 3:
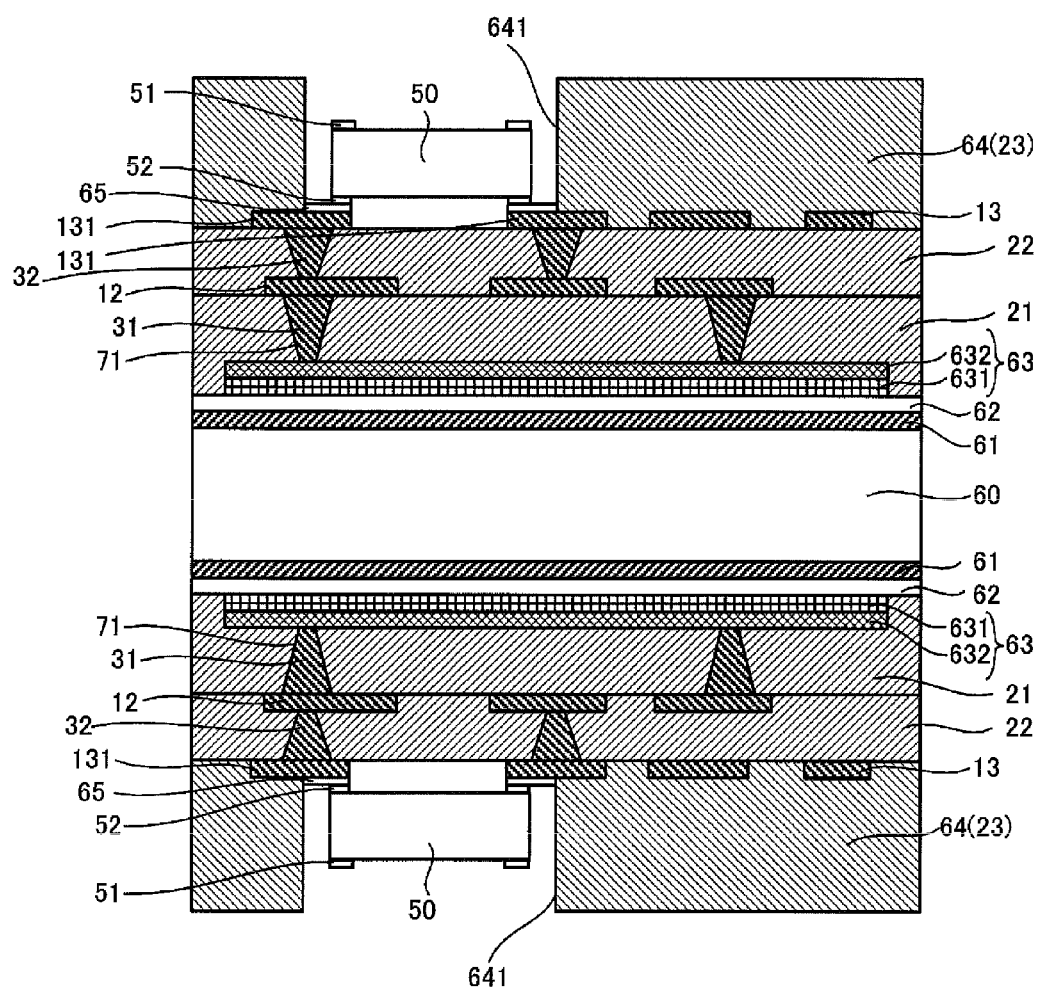
FIG. 3 is a first sectional view showing a manufacturing process of a multilayer wiring board of a first embodiment.

As shown in FIG. 3, first, a support substrate 60 on both surfaces of which conductor layers 61 (in this embodiment, copper) are laminated is prepared. The support substrate 60 is, for example, a plate-like member in which glass fiber is impregnated with epoxy resin, and has high rigidity.

For each of both surfaces of the support substrate 60, in a state where a release sheet 63 is arranged on the conductor layer 61 through a prepreg 62 serving as an adhesive layer, the release sheet 63 is pressed against the support substrate 60 by, for example, vacuum hot pressing, thereby laminating the release sheet 63. The release sheet 63 is constituted by laminating a metal layer 631 (in this embodiment, copper) and a metal layer 632 (in this embodiment, copper). Since metal plating (for example, Cr plating) is performed between the metal layer 631 and the metal layer 632, the metal layer 631 and the metal layer 632 are laminated in a releasable state.

Next, for each of both surfaces of the support substrate 60, a photosensitive dry film is laminated on the release sheet 63, exposure and development are then performed, and etching is performed to remove the outer circumferential portion of the release sheet 63. Thereafter, the dry film on the release sheet 63 is removed by etching.

For each of both surfaces of the support substrate 60, a film-like resin material (for example, epoxy resin) is arranged on the release sheet 63, and the resin material is hardened by pressurization and heating under vacuum to form the insulating layer 21. Accordingly, the release sheet 63 and the prepreg 62 in the outer circumferential portion where the release sheet 63 is removed are covered with the insulating layer 21.

For each of both surfaces of the support substrate 60, laser is irradiated at a predetermined position on the surface of the insulating layer 21 to form a plurality of via holes 71 in the insulating layer 21. Processing (desmear processing) for removing smear generated in the via holes 71 with the formation of the via holes 71 is performed. Thereafter, electroless plating is performed such that a thin electroless plated layer (in this embodiment, copper) is formed on the insulating layer 21. A predetermined resist pattern corresponding to the wiring pattern of the conductor layer 12 is formed on the electroless plated layer. Electroplating is performed such that a plated layer (in this embodiment, copper) is formed in a region which is not covered with resist. Thereafter, an unnecessary electroless plated layer and resist are removed by etching. Accordingly, the via conductors 31 are formed in the via holes 71, and the conductor layer 12 having a predetermined wiring pattern is formed.

By means of the same process as the formation of the insulating layer 21, the conductor layer 12, and the via conductors 31, the insulating layer 22, the conductor layer 13, and the via conductors 32 are formed on the insulating layer 21.

Of the conductor layer 13 arranged on the insulating layer 22, the conductor layer 13 in an opening 641 of a prepreg 64 described below forms pads 131 for electrical connection to the connection terminals 52 provided in the bottom surface of the semiconductor chip 50.

For this reason, after solder paste 65 is coated on the pads 131, the semiconductor chip 50 is placed on the pads 131. The solder paste 65 reflows. Accordingly, the semiconductor chip 50 is fixed such that voids are formed between the pads 131 and the connection terminals 52.

Next, a prepreg 64 including a sheet-like glass fiber impregnated with resin is prepared. The prepreg 64 is punched out by, for example, drilling, punching, or laser to form an opening 641 capable of accommodating the semiconductor chip 50 at a predetermined position where the semiconductor chip 50 is buried.

Thereafter, the prepreg 64 in which the opening 641 is formed is laminated on the insulating layer 22. Accordingly, the semiconductor chip 50 is accommodated in the opening 641 of the prepreg 64 laminated on the insulating layer 22.

Figure 4:
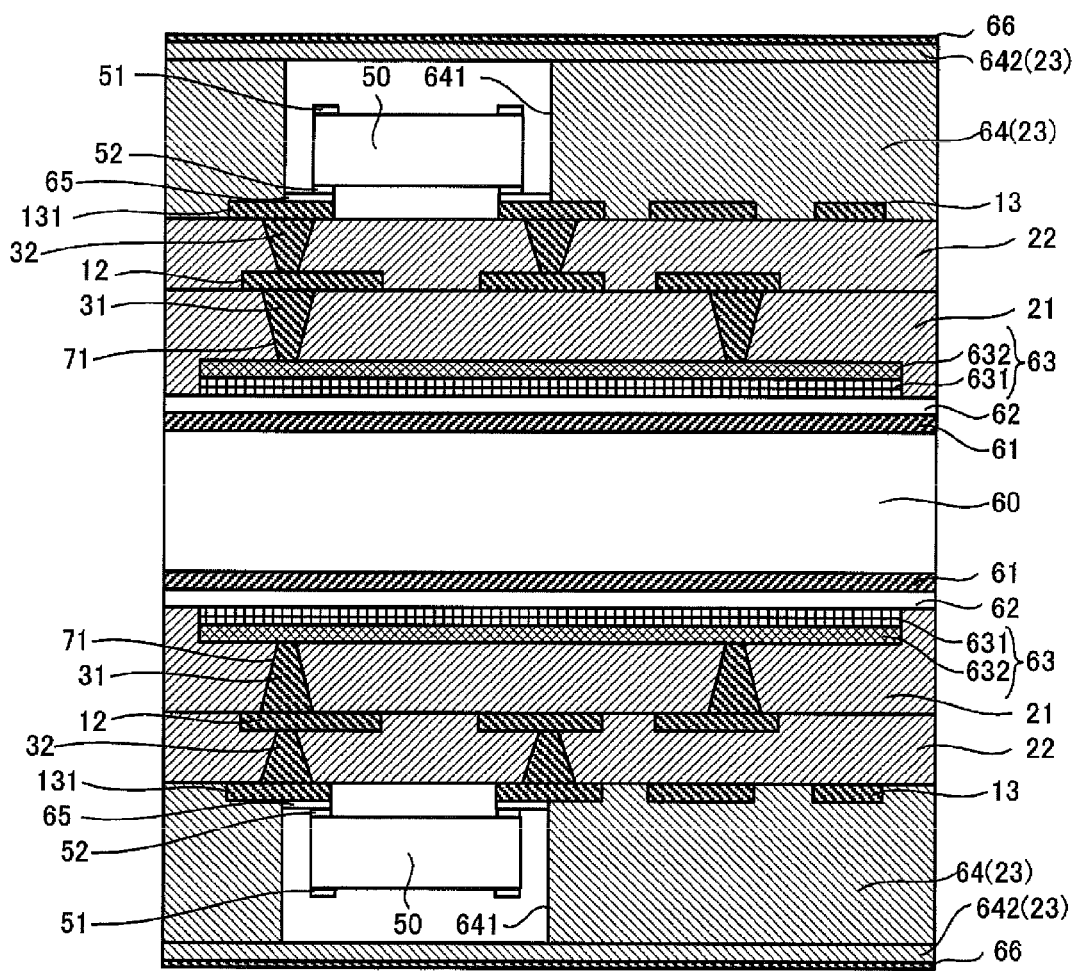
FIG. 4 is a second sectional view showing a manufacturing process of the multilayer wiring board of the first embodiment.
Figure 5:
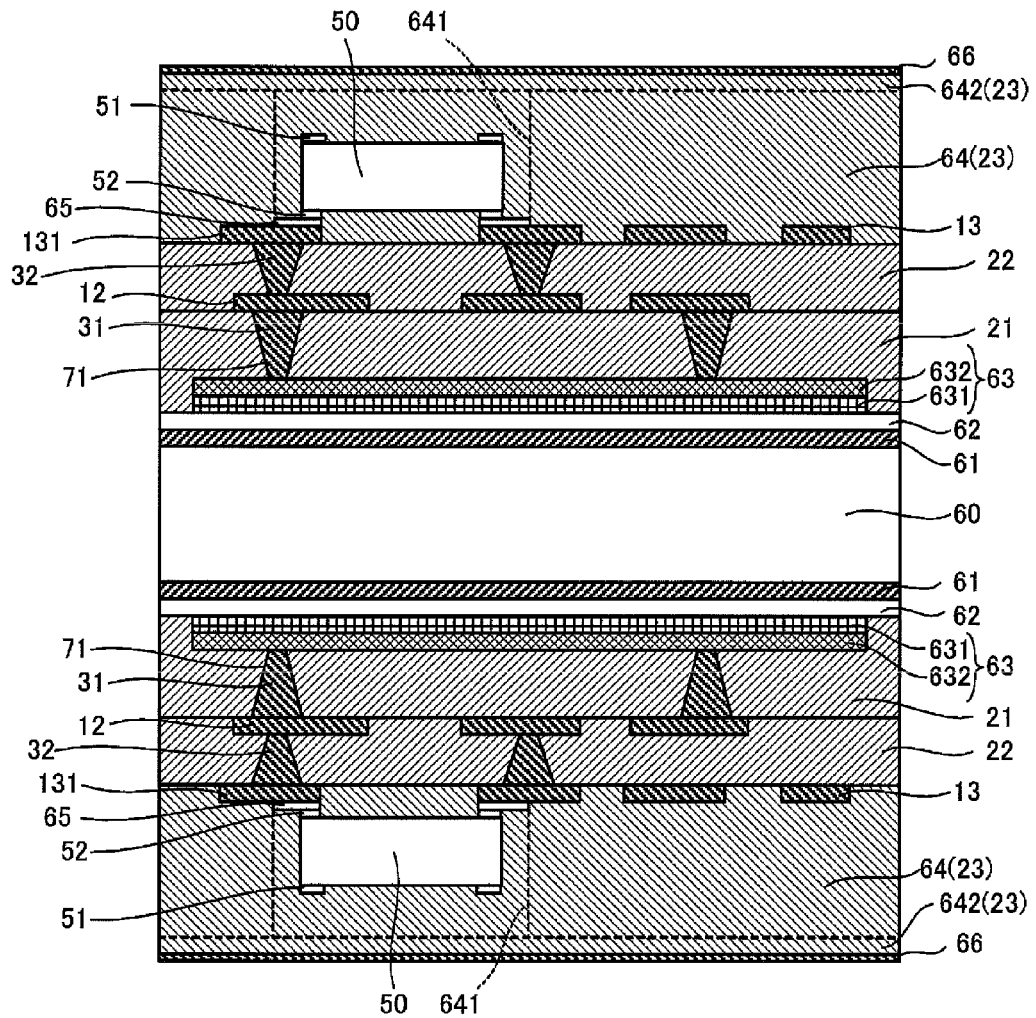
FIG. 5 is a third sectional view showing a manufacturing process of the multilayer wiring board of the first embodiment.

Thereafter, as shown in FIG. 4, an insulating layer 642, on the surface of which a metal layer 66 is formed and which includes a sheet-like glass fiber impregnated with resin, is laminated on the prepreg 64, and pressurization and heating (in this embodiment, 220° C. and 90 minutes) are performed through the metal layer 66. Accordingly, resin in the prepreg 64 is molten and flows into the opening 641, and as shown in FIG. 5, resin is filled in the opening 641. Therefore, the prepreg 64 and the insulating layer 642 correspond to the insulating layer 23.

Figure 6:
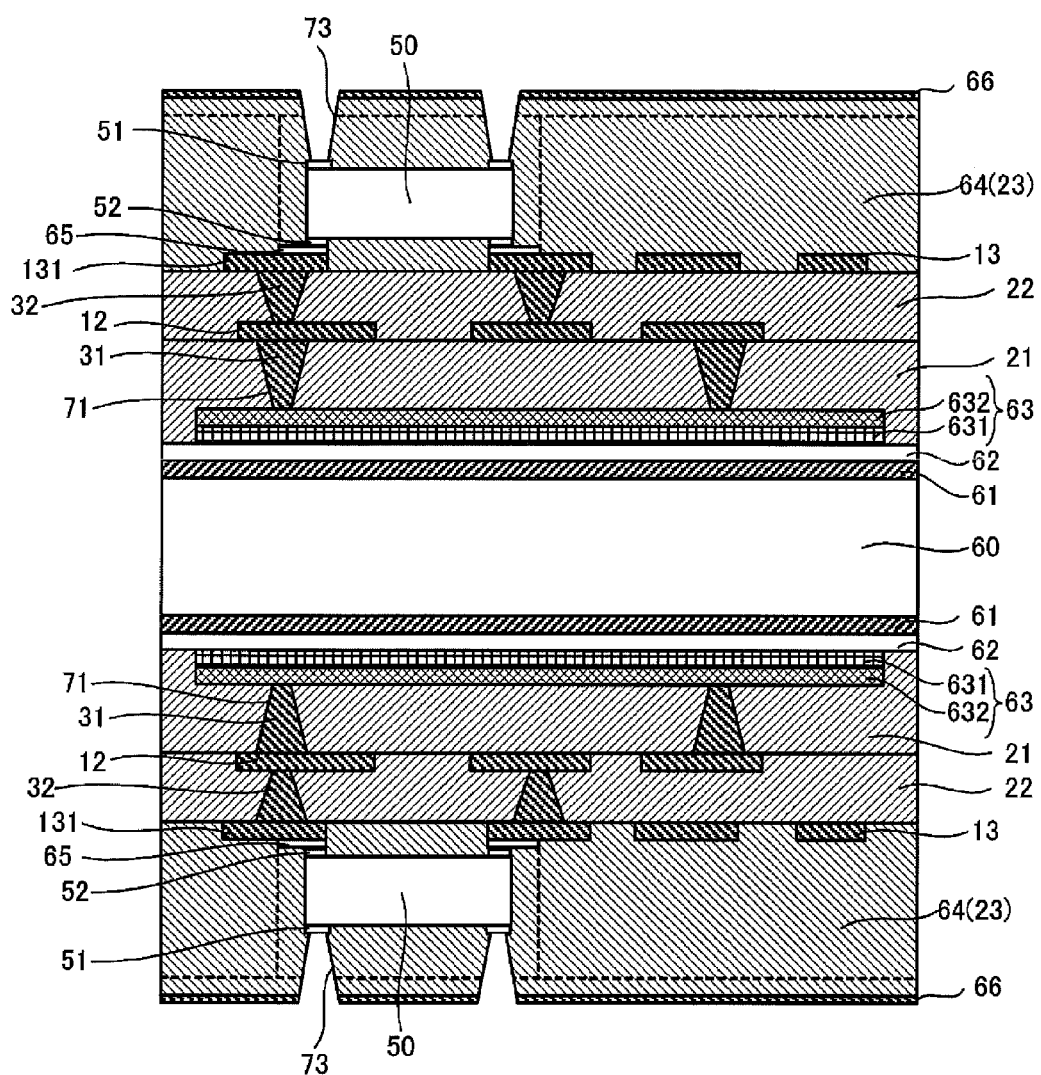
FIG. 6 is a fourth sectional view showing a manufacturing process of the multilayer wiring board of the first embodiment.
Figure 7:
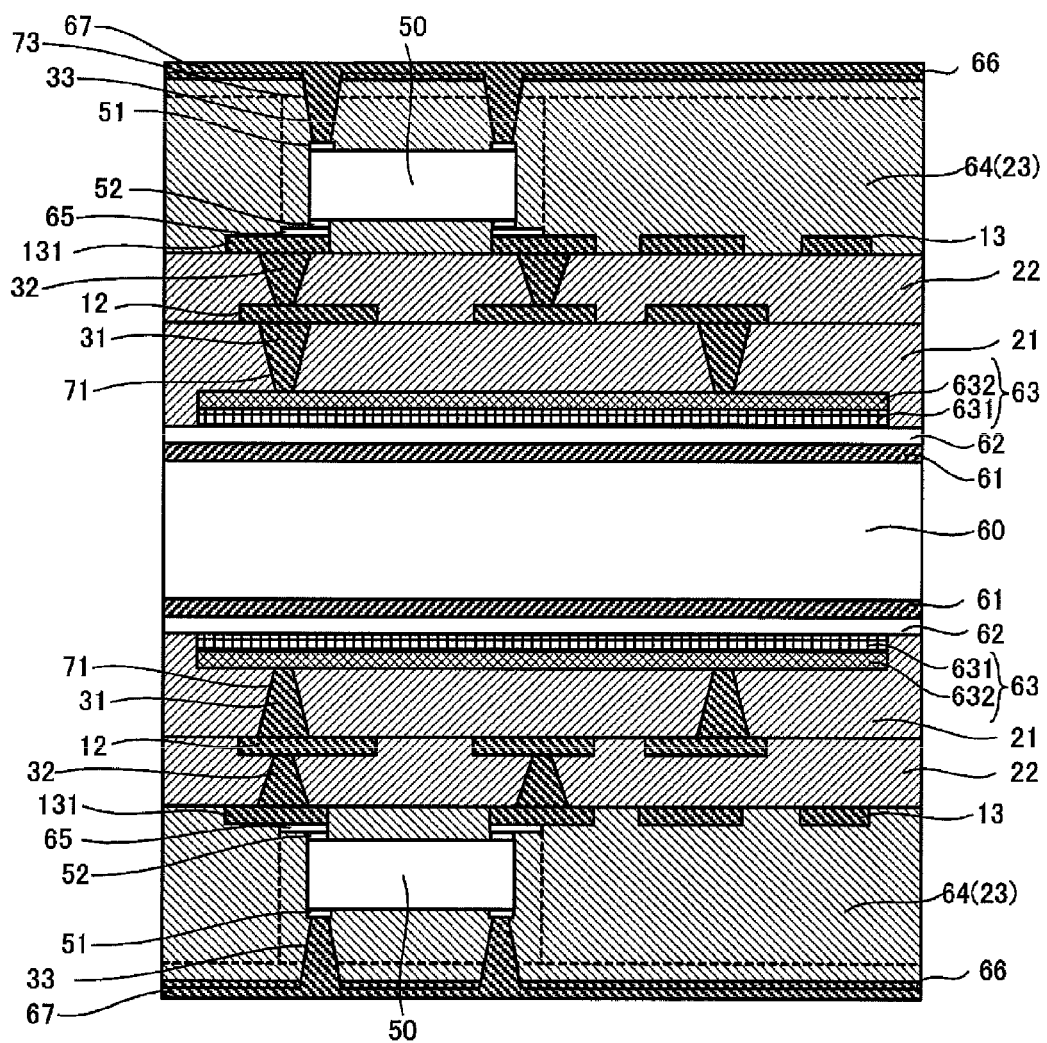
FIG. 7 is a fifth sectional view showing a manufacturing process of the multilayer wiring board of the first embodiment.

Next, laser is irradiated at a predetermined position on the surface of the metal layer 66 such that, as shown in FIG. 6, a plurality of via holes 73 which pass through the metal layer 66 are formed in the prepreg 64 (insulating layer 23). Desmear processing for removing smear generated in the via holes 73 is performed. Thereafter, electroless plating is performed to form an electroless plated layer (in this embodiment, copper) on the inner circumferential surface of the via holes 73. Electroplating is performed such that, as shown in FIG. 7, a plated layer 67 (in this embodiment, copper) is formed on the metal layer 66, and the via conductors 33 are formed in the via holes 73.

Figure 8:
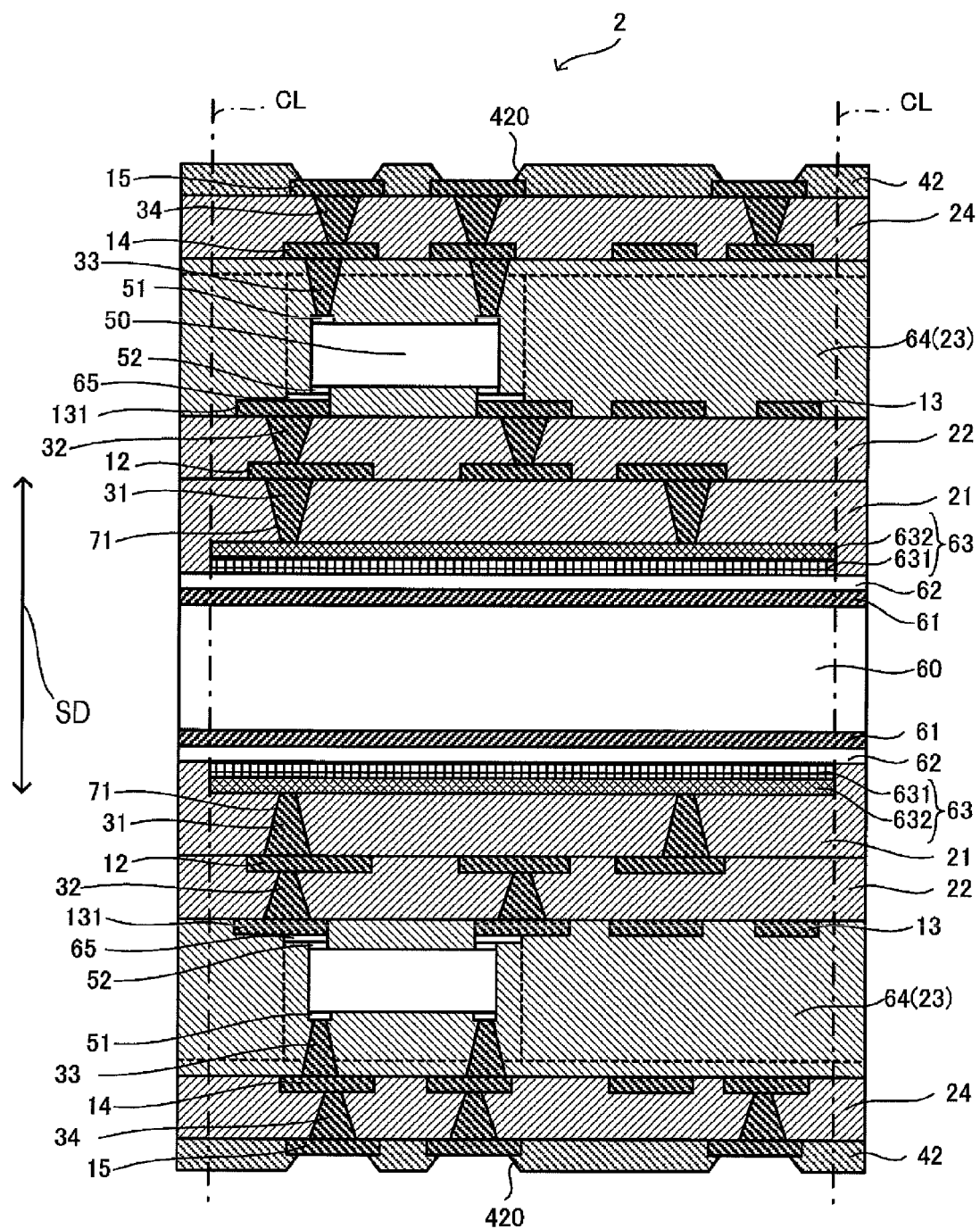
FIG. 8 is a sixth sectional view showing a manufacturing process of the multilayer wiring board of the first embodiment.

Thereafter, a predetermined resist pattern corresponding to the wiring pattern of the conductor layer 14 is formed on the plated layer 67, and the metal layer 66 and the plated layer 67 in a region which is not covered with resist are removed by etching. Accordingly, as shown in FIG. 8, the conductor layer 14 having a predetermined wiring pattern is formed. That is, the metal layer 66 and the plated layer 67 correspond to the conductor layer 14.

By means of the same process as the formation of the insulating layer 21, the conductor layer 12, and the via conductors 31, the insulating layer 24, the conductor layer 15, and the via conductors 34 are formed on the insulating layer 23.

After solder resist made of an organic resin material, such as epoxy resin, is coated so as to cover the insulating layer 24 and the conductor layer 15, the solder resist is patterned. Accordingly, the solder resist layer 42 having an opening 420 in a region where the conductor layer 15 is arranged is formed on the insulating layer 24.

Next, a laminate 2 in which the release sheets 63, the conductor layers 12 to 15, the insulating layers 21 to 24, and the like are laminated on the support substrate 60 by the above-described process is cut along a cutting-plane line CL which passes inside slightly from the outer edges of the release sheets 63 and is parallel to the lamination direction SD. Accordingly, the outer circumferential portion of the laminate 2 is removed, and the end surfaces of the outer circumferential portions of the release sheets 63 are exposed. For this reason, it becomes possible to release the metal layer 631 and the metal layer 632 from the end surfaces of the outer circumferential portions of the release sheets 63.

Figure 9:
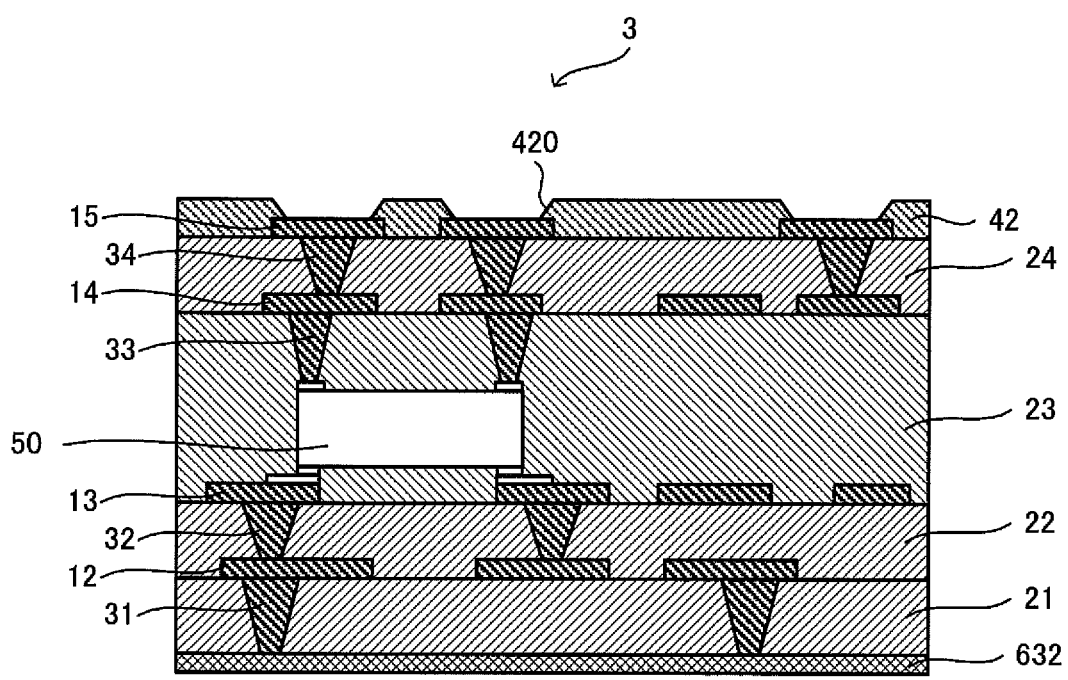
FIG. 9 is a seventh sectional view showing a manufacturing process of the multilayer wiring board of the first embodiment.

By releasing the metal layer 631 from the metal layer 632, as shown in FIG. 9, a laminate 3 in which the conductor layers 12 to 15, the insulating layers 21 to 24, and the like are laminated on the metal layer 632 is separated from the support substrate 60. Accordingly, two laminates 3 can be obtained.

A photosensitive dry film is laminated on the metal layer 632 of the laminate 3, exposure and development are then performed, and then etching is performed. Thus, as shown in FIG. 1, the conductor layer 11 is formed.

After solder resist made of an organic resin material, such as epoxy resin, is coated so as to cover the insulating layer 21 and the conductor layer 11, the solder resist is patterned. Accordingly, the solder resist layer 41 having the opening 410 in a region where the conductor layer 11 is arranged is formed on the insulating layer 21, thereby obtaining the multilayer wiring board 1.

A method of manufacturing the multilayer wiring board 1 configured as described above has a first step of forming, on the support substrate 60, a laminate in which the insulating layers 21 and 22 and the conductor layers 12 and 13 are alternately laminated, a second step of fixing the semiconductor chip 50 on the surface of the laminate formed by the first step, a third step of forming the opening 641 capable of accommodating the semiconductor chip 50 in the prepreg 64 that includes a sheet-like glass fiber impregnated with resin, a fourth step of laminating the prepreg 64 on the insulating layer 22 such that the semiconductor chip 50 fixed by the second step is accommodated in the opening 641, and a fifth step of heating and pressurizing the surface of the laminated prepreg 64.

In the method of manufacturing the multilayer wiring board 1 configured as described above, since the opening 641 is formed in the prepreg 64, in the step of laminating the prepreg 64 on the insulating layer 22, the pressing force of the prepreg 64 against the semiconductor chip 50 is not applied to the semiconductor chip 50.

Thereafter, in the fifth step, if the surface of the laminated prepreg 64 is heated and pressurized, resin in the prepreg 64 is molten and flows into the opening 641, and resin is filled in the opening 641. Accordingly, the semiconductor chip 50 is buried in the prepreg 64. In the fifth step, since resin is molten and flows into the opening 641, and resin is formed on the semiconductor chip 50, the pressing force of the prepreg 64 against the semiconductor chip 50 is not applied to the semiconductor chip 50.

With the above, when the semiconductor chip 50 is buried in the prepreg 64, the pressing force of the prepreg 64 against the semiconductor chip 50 is not applied to the semiconductor chip 50, thereby suppressing the occurrence of failure in the semiconductor chip 50 embedded in the multilayer wiring board 1.

In the third step, since the opening 641 capable of accommodating the semiconductor chip 50 is formed in the prepreg 64, glass fiber is not arranged above the semiconductor chip 50 in the prepreg 64. For this reason, when forming the via holes 73 for electrical connection between the semiconductor chip 50 buried in the prepreg 64 and the conductor layer 14 formed on the prepreg 64, it is not necessary to pass through a material having high rigidity, such as glass fiber, in the prepreg 64.

In the second step, after the solder paste 65 is provided on the pads 131 and the semiconductor chip 50 is arranged, the solder paste 65 reflows to fix the semiconductor chip 50 such that the voids are formed between the pads 131 and the connection terminals 52. For this reason, resin that is molten due to heating and pressurizing the surface of the prepreg 64 flows below the semiconductor chip 50. Accordingly, when the semiconductor chip 50 is buried in the prepreg 64, the entire surface of the semiconductor chip 50 (that is, the top surface, the lateral surface, and the bottom surface of the electronic component) can be covered with resin.

The pads 131 for placing the semiconductor chip 50 are formed such that the length in the short-side direction D1 of the bottom surface of the semiconductor chip 50 is shorter than the connection terminals 52. Accordingly, when molten resin flows below the semiconductor chip 50, it is possible to suppress the occurrence of a situation in which the flow of molten resin is obstructed by the pads 131 below the semiconductor chip 50, thereby easily forming resin below the semiconductor chip 50.

The insulating layer 642, on the surface of which the metal layer 66 serving as the conductor layer 14 formed through patterning and including a sheet-like glass fiber impregnated with resin, is laminated on the surface of the prepreg 64, and in the fifth step, the prepreg 64 is heated and pressurized through the metal layer 66. That is, after the prepreg 64 is heated and pressurized, the metal layer 66 is patterned and thus used as the conductor layer 14 of the multilayer wiring board 1. For this reason, it is possible to save a metal material for the amount corresponding to the metal layer 66 compared to a process in which the metal layer 66 is removed after the prepreg 64 is heated and pressurized, and the conductor layer 14 is laminated.

In the embodiment described above, the laminate in which the insulating layers 21 and 22 and the conductor layers 12 and 13 are alternately laminated is the laminate in the invention, the semiconductor chip 50 is the electronic component in the invention, the prepreg 64 is the prepreg in the invention, the opening 641 is the opening in the invention, the pads 131 are the pads in the invention, the short-side direction D1 of the bottom surface of the semiconductor chip 50 is the lamination orthogonal direction in the invention, and the metal layer 66 is the metal layer in the invention.

Second Embodiment

Hereinafter, a second embodiment of the invention will be described with reference to the drawings. In the second embodiment, portions different from the first embodiment will be described.

In the second embodiment, a method of accommodating the semiconductor chip 50 in the prepreg 64 is different from the first embodiment.

Figure 10:
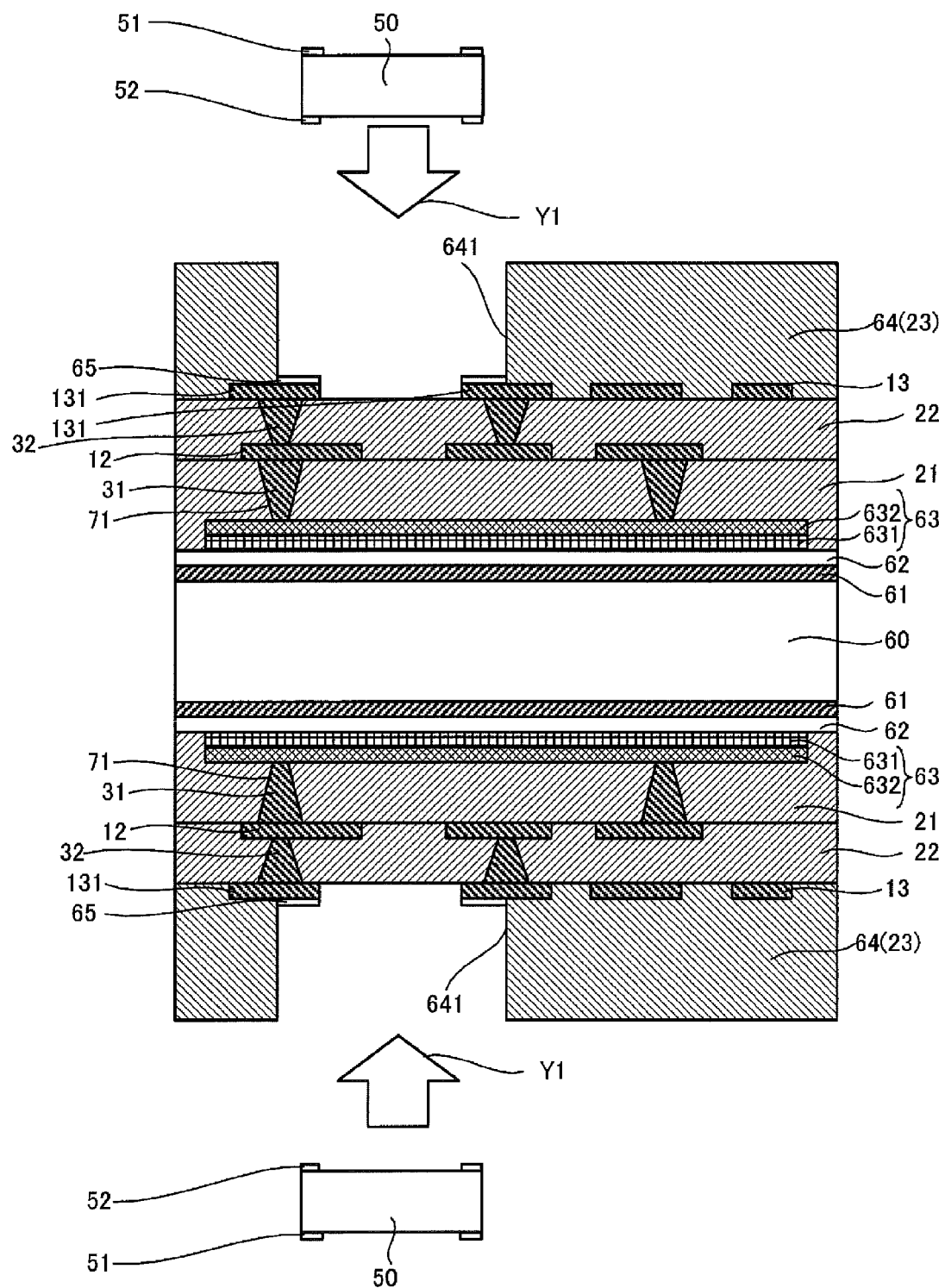
FIG. 10 is a first sectional view showing a manufacturing process of a multilayer wiring board of a second embodiment.

That is, as shown in FIG. 10, after the prepreg 64 in which the opening 641 is formed is laminated on the insulating layer 22, the semiconductor chip 50 is accommodated in the opening 641 of the prepreg 64 (see arrow Y1 in FIG. 10). After the solder paste 65 is coated on the pads 131, the semiconductor chip 50 is placed on the pads 131, and the solder paste 65 is reflowed. Accordingly, the semiconductor chip 50 is fixed such that the voids are formed between the pads 131 and the connection terminals 52. The subsequent process is the same as in the first embodiment.

A method of manufacturing the multilayer wiring board 1 configured as described above has a step of forming, on the support substrate 60, the laminate in which the insulating layers 21 and 22 and the conductor layers 12 and 13 are alternately laminated, a step of forming the prepreg 64, which has the opening 641 capable of accommodating the semiconductor chip 50 and a sheet-like glass fiber impregnated with resin, on the insulating layer 22, a step of accommodating the semiconductor chip 50 in the opening 641, and an step of heating and pressurizing the surface of the prepreg 64. The sixth step includes the steps of forming the opening 641 in the prepreg 64, and laminating the prepreg 64 having the opening 641 on the insulating layer 22.

In the method of manufacturing the multilayer wiring board 1 configured as described above, in the step of forming the prepreg 64, the prepreg 64 which has the opening 641 capable of accommodating the semiconductor chip 50 is formed on the insulating layer 22, and in the step of accommodating the semiconductor chip 50, the semiconductor chip 50 is accommodated in the opening 641. For this reason, in the step of accommodating the semiconductor chip 50 in the opening 641, the pressing force of the prepreg 64 against the semiconductor chip 50 is not applied to the semiconductor chip 50.

Thereafter, in the step of heating and pressurizing the surface of the laminated prepreg 64, resin in the prepreg 64 is molten and flows into the opening 641, and resin is filled in the opening 641. Accordingly, the semiconductor chip 50 is buried in the prepreg 64. In the step of heating and pressurizing, since resin is molten and flows into the opening 641, and resin is formed on the semiconductor chip 50, the pressing force of the prepreg 64 against the semiconductor chip 50 is not applied to the semiconductor chip 50.

With the above, when the semiconductor chip 50 is buried in the prepreg 64, the pressing force of the prepreg 64 against the semiconductor chip 50 is not applied to the semiconductor chip 50, thereby suppressing the occurrence of failure in the semiconductor chip 50 embedded in the multilayer wiring board 1.

Third Embodiment

Hereinafter, a third embodiment of the invention will be described. In the third embodiment, portions different from the first embodiment will be described.

In the third embodiment, a method of accommodating the semiconductor chip 50 in the prepreg 64 is different from the first embodiment.

Figure 11:
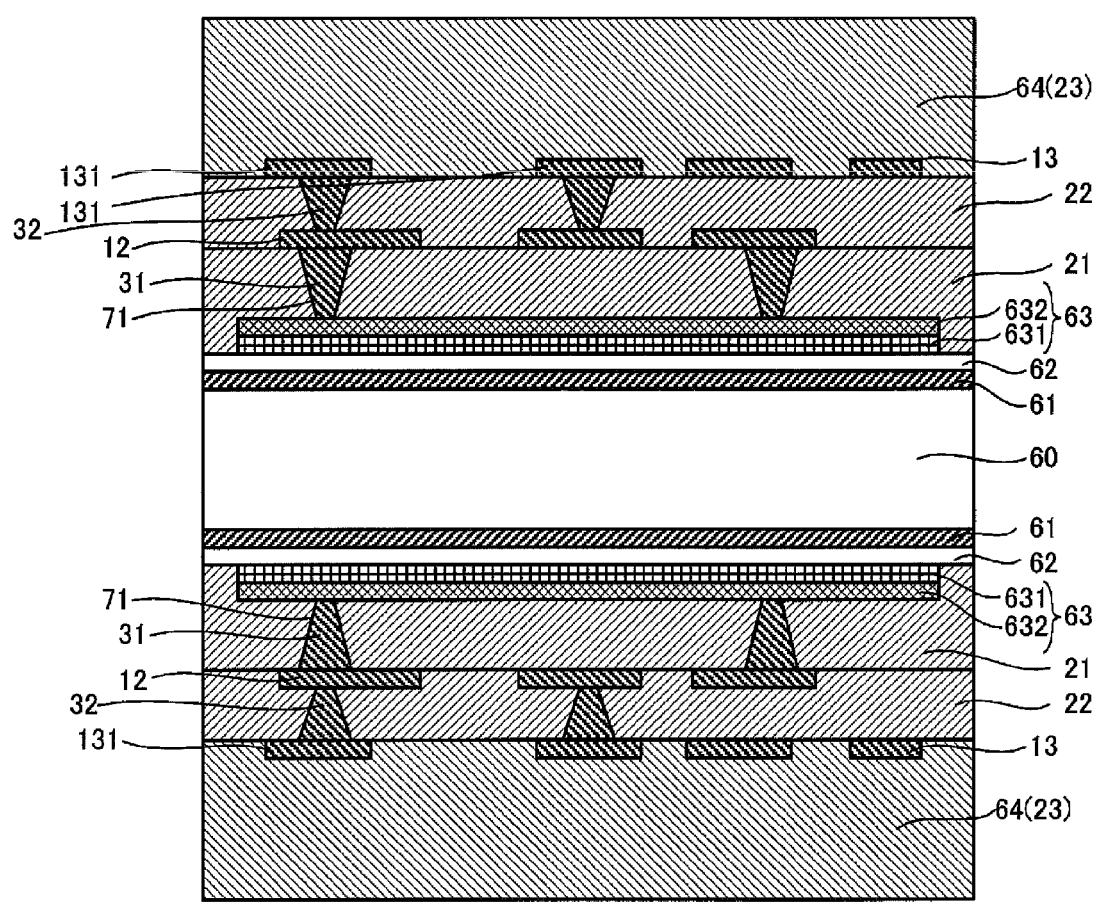
FIG. 11 is a first sectional view showing a manufacturing process of a multilayer wiring board of a third embodiment.

That is, as shown in FIG. 11, after the insulating layer 22, the conductor layer 13, and the via conductors 32 are formed on the insulating layer 21, the prepreg 64 is laminated on the insulating layer 22.

Figure 12:
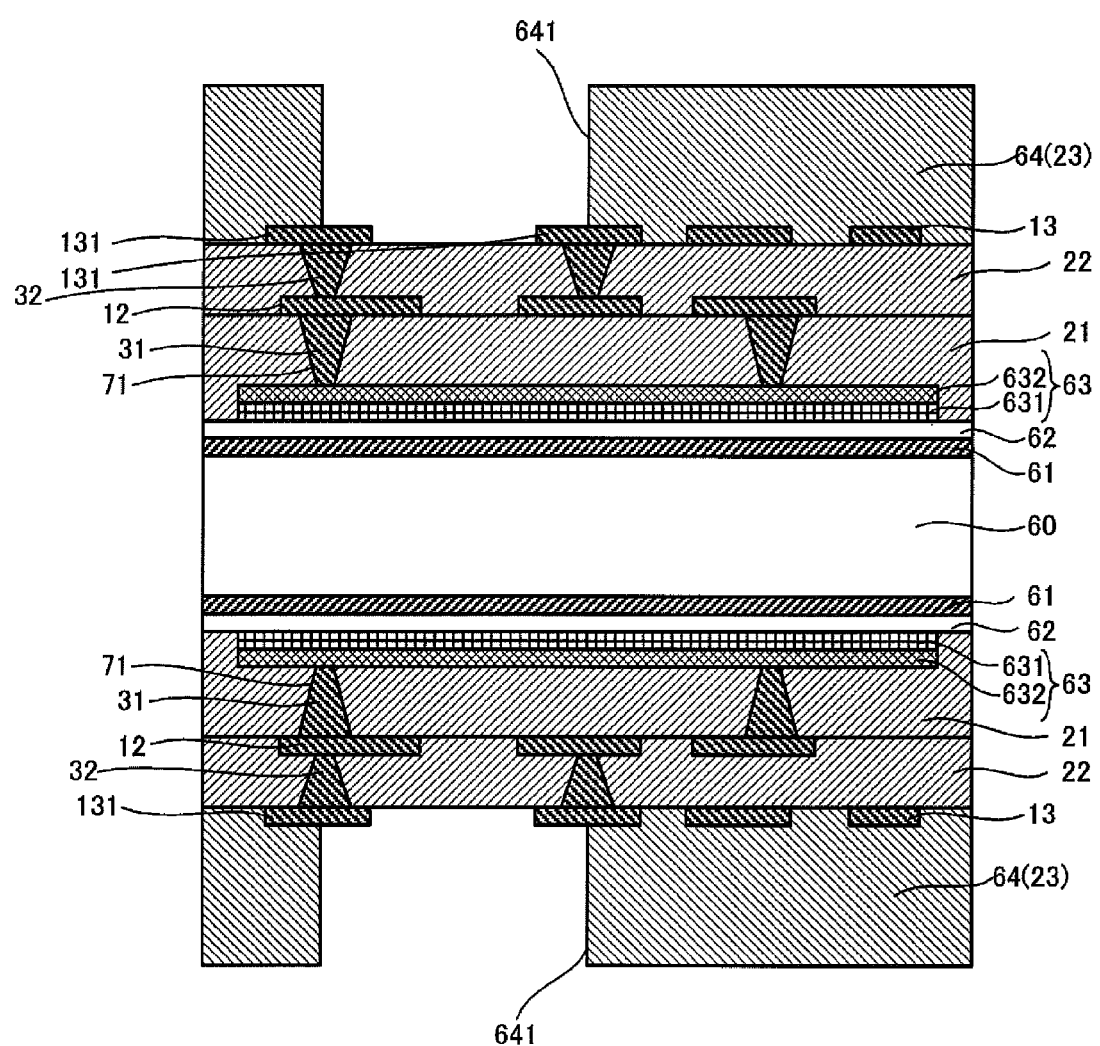
FIG. 12 is a second sectional view showing a manufacturing process of the multilayer wiring board of the third embodiment.

Thereafter, as shown in FIG. 12, the opening 641 capable of accommodating the semiconductor chip 50 is formed at a predetermined position where the semiconductor chip 50 will be buried. In this embodiment, for example, the prepreg 64 is punched out by, for example, laser to form the opening 641.

If the solder paste 65 is coated on the pads 131 and the semiconductor chip 50 is placed on the pads 131, as shown in FIG. 3, the semiconductor chip 50 is accommodated in the opening 641 of the prepreg 64. Thereafter, the solder paste 65 reflows. Accordingly, the semiconductor chip 50 is fixed such that the voids are formed between the pads 131 and the connection terminals 52. The subsequent process is the same as in the first embodiment.

A method of manufacturing the multilayer wiring board 1 configured as described above has a step of forming, on the support substrate 60, the laminate in which insulating layers 21 and 22 and the conductor layers 12 and 13 are alternately laminated, a step of laminating the prepreg 64, which has the opening 641 capable of accommodating the semiconductor chip 50 and a sheet-like glass fiber impregnated with resin, on the insulating layer 22, a step of accommodating the semiconductor chip 50 in the opening 641, and an step of heating and pressurizing the surface of the prepreg 64. In the step of laminating the prepreg 64, after the prepreg 64 is laminated on the insulating layer 22, the opening 641 is formed in the prepreg 64.

In the method of manufacturing the multilayer wiring board 1 configured as described above, as in the second embodiment, in a state where the prepreg 64 is formed on the insulating layer 22, and the opening 641 is formed in the prepreg 64, the semiconductor chip 50 is accommodated in the opening 641. For this reason, the method of manufacturing the multilayer wiring board 1 of the third embodiment achieves the same effects as in the second embodiment.

Although the embodiments of the invention have been described, the invention is not limited to the foregoing embodiments, and various modifications may be made without departing from the technical scope of the invention.

What is claimed is:

1. A method of manufacturing a multilayer wiring board in which a plurality of insulating layers and a plurality of conductor layers are alternately laminated, the method comprising:
   a step of forming, on a support substrate, a laminate in which at least one insulating layer and at least one conductor layer are alternately laminated;
   a step of forming a prepreg, which has an opening capable of accommodating an electronic component and a sheet-like glass fiber impregnated with resin, on a surface of the laminate;
   a step of accommodating the electronic component in the opening; and
   a step of heating and pressurizing a surface of the prepreg such that an upper surface of the electronic component is covered with molten resin of the prepreg.

2. The method according to claim 1, wherein the step of forming the prepreg includes:
   a step of forming the opening in the prepreg, and
   a step of laminating the prepreg having the opening on the surface of the laminate.

3. The method according to claim 1, wherein the step of forming the prepreg includes, in the following order:
   a step of laminating the prepreg on the surface of the laminate, and
   a step of forming the opening in the prepreg.

4. The method according to claim 1, wherein upon accommodating the electronic component in the opening an upper surface of the electronic component is below an upper surface of the prepreg such that a pressing force used in the step of heating and pressurizing the surface of prepreg is not applied to the upper surface of the electronic component.

5. A method of manufacturing a multilayer wiring board in which a plurality of insulating layers and a plurality of conductor layers are alternately laminated, the method comprising:
   a first step of forming, on a support substrate, a laminate in which at least one insulating layer and at least one conductor layer are alternately laminated;
   a second step of fixing an electronic component on a surface of the laminate formed by the first step;
   a third step of forming an opening capable of accommodating the electronic component in a prepreg which includes a sheet-like glass fiber impregnated with resin;
   a fourth step of laminating the prepreg with the opening formed by the third step on the surface of the laminate such that the electronic component fixed by the second step is accommodated in the opening; and
   a fifth step of heating and pressurizing a surface of the prepreg laminated on the surface of the laminate by the fourth step such that an upper surface of the electronic component fixed by the second step is covered with molten resin of the prepreg.

6. The method according to claim 5, wherein:
   in the first step, pads for electrical connection to connection terminals of the electronic component are formed on the surface of the laminate, and
   in the second step, after a solder paste is provided on the pads and the electronic component is placed on the surface of the laminate, the solder paste is reflowed to fix the electronic component such that voids are formed between the pads and the connection terminals.

7. The method according to claim 6, wherein, when a direction orthogonal to a lamination direction of the laminate is referred to as a lamination orthogonal direction, a length in the lamination orthogonal direction of the pads is shorter than a length in the lamination orthogonal direction of the electronic component placed on the surface of the laminate.

8. The method according to claim 5, wherein:
   an insulating layer, including on a surface thereof a metal layer serving as a conductor layer that is formed through patterning and including a sheet-like glass fiber impregnated with resin, is laminated on the surface of the prepreg, and
   in the fifth step, the prepreg is heated and pressurized through the metal layer.

9. The method according to claim 5, wherein upon laminating the prepreg on the surface of the laminate an upper surface of the electronic component is below an upper surface of the prepreg such that a first pressing force used in the fourth step of laminating the prepreg on the surface of the laminate is not applied to the upper surface of the electronic component and such that a second pressing force used in the fifth step of heating and pressurizing the prepreg laminated on the surface of the laminate is not applied to the upper surface of the electronic component.

\* \* \* \* \*